(12) United States Patent
Stevenson et al.

(10) Patent No.: US 9,242,271 B2
(45) Date of Patent: Jan. 26, 2016

(54) CHEMICAL AND ELECTROCHEMICAL SYNTHESIS AND DEPOSITION OF CHALCOGENIDES FROM ROOM TEMPERATURE IONIC LIQUIDS

(71) Applicant: BOARD OF REGENTS, THE UNIVERSITY OF TEXAS SYSTEM, Austin, TX (US)

(72) Inventors: Keith J. Stevenson, Austin, TX (US); Sankaran Murugesan, Austin, TX (US); Patrick Kearns, Minneapolis, MN (US); Arunkumar Akkineni, Austin, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 495 days.

(21) Appl. No.: 13/622,812

(22) Filed: Sep. 19, 2012

(65) Prior Publication Data

US 2013/0112110 A1    May 9, 2013

Related U.S. Application Data

(60) Provisional application No. 61/537,366, filed on Sep. 21, 2011.

(51) Int. Cl.
| | |
|---|---|
| *C25D 3/56* | (2006.01) |
| *B05D 7/24* | (2006.01) |
| *H01L 21/02* | (2006.01) |
| *C25D 3/66* | (2006.01) |
| *C25B 1/00* | (2006.01) |
| *C25D 7/12* | (2006.01) |

(52) U.S. Cl.
CPC ... *B05D 7/24* (2013.01); *C25B 1/00* (2013.01); *C25D 3/56* (2013.01); *C25D 3/665* (2013.01); *H01L 21/02417* (2013.01); *C25D 7/12* (2013.01)

(58) Field of Classification Search
CPC ............ C25D 3/66–3/665; C25D 7/12–7/123; H01L 21/02417–21/02568
USPC .................................................. 205/230–236
See application file for complete search history.

(56) References Cited

U.S. PATENT DOCUMENTS

| | | | |
|---|---|---|---|
| 2006/0166474 A1* | 7/2006 | Vereecken et al. ............ | 438/584 |
| 2009/0205714 A1* | 8/2009 | Kuhnlein et al. ............. | 136/264 |
| 2011/0183205 A1* | 7/2011 | Graczyk et al. ............ | 429/218.1 |

FOREIGN PATENT DOCUMENTS

| | | | |
|---|---|---|---|
| CN | 1752745 A | * 3/2006 | |
| WO | WO 2009/112714 A2 | * 2/2009 | .............. H01M 4/38 |

OTHER PUBLICATIONS

Dale et al., Synthesis of Cadmium and Zinc Semiconductor Compounds from an Ionic liquid Containing Choline Chloride and Urea, 515 Thin Solid Films 5751 (2007).*
Wang et al., CN 1752745 A, Machine Translation (2006).*

* cited by examiner

*Primary Examiner* — James Lin
*Assistant Examiner* — Ho-Sung Chung
(74) *Attorney, Agent, or Firm* — Reed Smith LLP; Robert R. Riddle; Matthew S. Gibson

(57) ABSTRACT

Room temperature electrochemical methods to deposit thin films of chalcogenide glasses.

2 Claims, 15 Drawing Sheets

CHEMICAL AND ELECTROCHEMICAL SYNTHESIS AND DEPOSITION OF CHALCOGENIDES FROM ROOM TEMPERATURE IONIC LIQUIDS

CROSS-REFERENCE TO RELATED APPLICATIONS

This application claims the benefit of U.S. Provisional Patent Application Ser. No. 61/537,366, filed on Sep. 21, 2011, the entire disclosure of which is hereby incorporated by reference.

BACKGROUND

Chalcogenide glasses and films are promising materials for use as solid electrolytes. These materials are used for different applications, such as optical and photonic materials (laser, fiber optics, and optical lenses for infrared transmission), rewritable optical discs, and non-volatile memory devices such as phase change memory. Currently they have been used in next generation non-volatile solid state memory such as electrochemical metallization memory cells (ECM) and conductive bridging random access memory (CBRAM). CBRAM works by sandwiching a metal chalcogenide solid electrolyte between an inert cathode and sacrificial anode. When a potential is applied, metal ions from the sacrificial anode migrate into the solid electrolyte and form a "conductive" bridge to the other electrode creating an electrical short. The resultant change in resistance can be a basis for a memory element. Several metal chalcogenides have shown promise as a solid state electrolyte in this application including, germanium chalcogenides (sulfide, selenide, and telluride compounds), arsenic chalcogenides compounds (sulfide, selenide, and telluride compounds), and molybdenum chalcogenides (sulfide, selenide, and telluride compounds). These compounds can be doped with several ions including $Ag^+$, $Li^+$, and $Cu^{+2}$. These materials have been shown to better survive the high temperature of back-end-of-line processing in integrated circuit manufacture. The materials in various forms also have uses in many other applications including inorganic photoresists, photonic devices, fiber optics, chemical sensors, optoelectronics and waveguides. The glasses and films may be useful in smart cards, integrated circuits, inorganic photoresists, transistors, field emitters, solid state lithium ion batteries. The glasses and films may also be useful in medical applications, photocatalytic applications, hydrogen evolution, and value added fuel generation.

There are several methods available for the preparation of chalcogenide glasses and films, particularly germanium sulfide glasses and molybdenum sulfide glasses, including sol-gel synthesis, chemical vapor deposition, and laser assisted chemical vapor deposition. Metal ion doping on chalcogenide glasses can be performed by conventional methods such as chemical vapor deposition, photo doping, and electrochemical methods. These methods have limitations because they require the use of high temperature, corrosive gases, or long processing time frames. Germanium sulfide and molybdenum sulfide formation by sol-gel synthesis involves the use of $H_2S$ gas with specialized equipment (stainless steel high pressure reactors) to keep the sample out of contact with the air and the reaction can take place for several days to month. Chemical vapor deposition involves the use of specialized equipment at high temperatures, around 400° C. to 700° C., as well as $H_2S$ gas. Deposition during CVD occurs at a rate of about 12 μm/hr. Furthermore, in conventional silver doping techniques, it is difficult to estimate the concentration of $Ag^+$ doped on the system.

Other techniques such as evaporation, sputtering, and ablation in general suffer from difficulties associated with the incorporation of impurities or non-stoichiometry, which degrade the properties of the chalcogenide glass. The synthesized products are not pure or uniform and depend upon the targets materials used in the synthesis. These options also have a limit to the speed, cost, and scale at which they can be produced.

SUMMARY

The present disclosure generally relates to methods for preparing chalcogenide glasses and films. More particularly, the present disclosure relates to methods for preparing chalcogenide glasses and films using room temperature ionic liquids.

In one embodiment, the present disclosure provides a method for fabricating a chalcogenide glass or film comprising: providing a solution comprising a room temperature ionic liquid, a metal precursor, and a chalcogenide precursor; providing a substrate; and applying the solution onto the substrate by a deposition process.

In another embodiment, the present disclosure provides a method for fabricating a chalcogenide glass or film comprising: providing a solution comprising a room temperature ionic liquid, a molybdenum precursor, and a chalcogenide precursor; providing a substrate; and applying the solution onto the substrate by a deposition process.

In another embodiment, the present disclosure provides a method for fabricating a molybdenum chalcogenide glass or film comprising: providing a solution comprising a $PP_{13}$-TFSI, molybdenum glycolate, and 1,4-butanedithiol; providing a substrate; and applying the solution onto the substrate by a deposition process.

The features and advantages of the present invention will be readily apparent to those skilled in the art. While numerous changes may be made by those skilled in the art, such changes are within the spirit of the invention.

DRAWINGS

Figure 11:
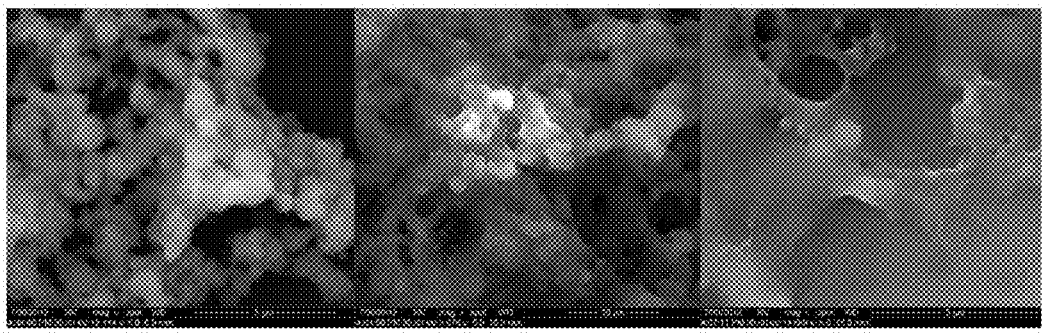

FIG. 11 an SEM analysis of $MoS_x$ film deposited on GC.

Figure 12:
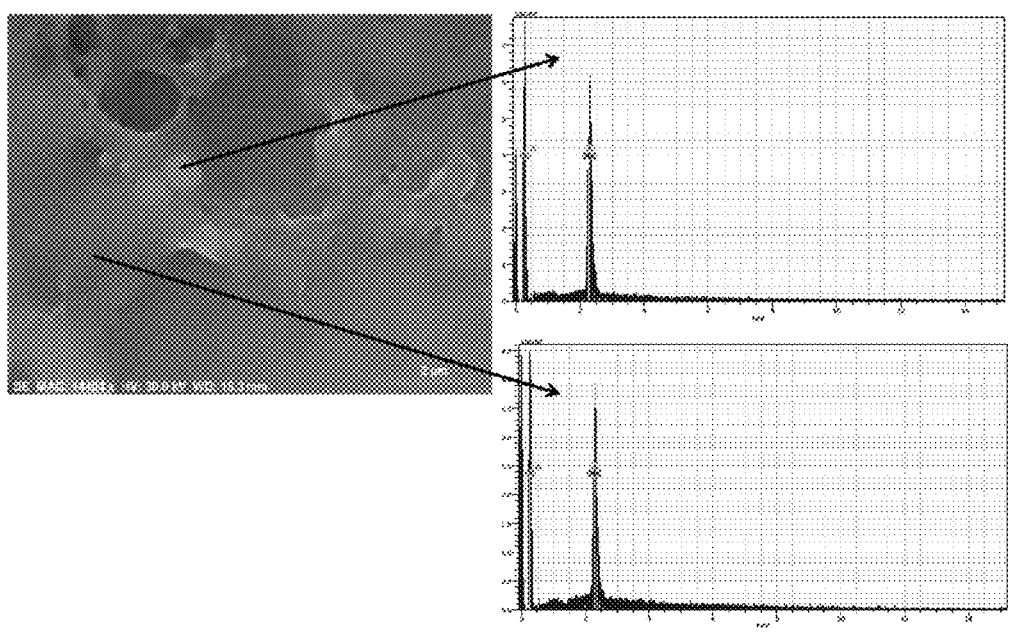

FIG. 12 an SEM-EDS analysis of MoS$_x$ film deposited on GC.

Figure 13:
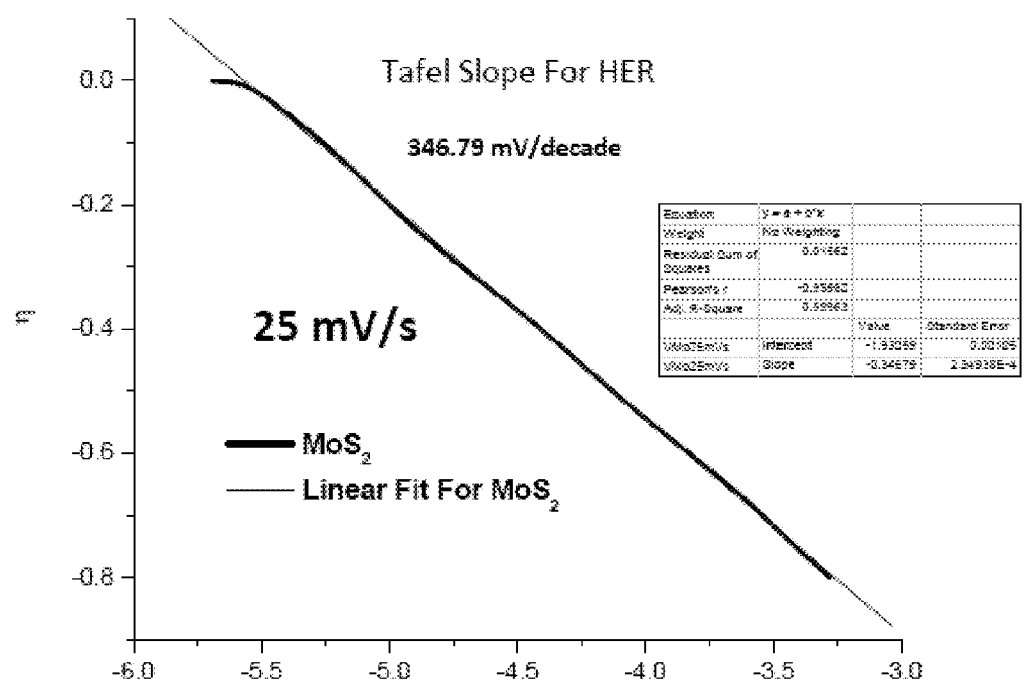

FIG. 13 is a chart depicting Hydrogen Evolution Reaction activity of MoS$_2$.

While the present disclosure is susceptible to various modifications and alternative forms, specific example embodiments have been shown in the figures and are described in more detail below. It should be understood, however, that the description of specific example embodiments is not intended to limit the invention to the particular forms disclosed, but on the contrary, this disclosure is to cover all modifications and equivalents as illustrated, in part, by the appended claims.

DESCRIPTION

The present disclosure generally relates to methods for preparing chalcogenide glasses and films. More particularly, the present disclosure relates to methods for preparing chalcogenide glasses and films using room temperature ionic liquids.

In certain embodiments, this present disclosure describes room temperature chemical and electrochemical synthetic methods for the preparation of chalcogenide glasses or films, especially germanium sulfide glasses and molybdenum sulfide glasses, using room temperature ionic liquids (RTILs). It has been shown that chemical and electrochemical reduction of soluble precursors produces chalcogenide glasses and films of varied structure and composition depending upon deposition conditions. These compounds can be doped using this method and others with several ions including Ag$^+$, Li$^+$, and Cu$^{+2}$.

The room temperature deposition methodology provides several advantages over other more high-energy-consuming, capital-intensive synthetic techniques such as chemical vapor deposition and vacuum sputtering including: (1) the ability to precisely control film thickness, uniformity, and deposition rate; (2) the ability to carefully regulate reaction parameters such as solution concentration, bath composition, pH, and temperature; and (3) the ability to form thin-film depositions on surfaces of complicated shape and morphology. Furthermore, the use of RTILs for chemical and electrochemical deposition provides a unique solvent environment for carrying out reduction of the precursors as they have negligible vapor pressure, high thermal stability, a wide electrochemical window of stability (>3V), high ionic conductivity, and virtually limitless chemical tenability. There are an abundance of deposition precursors that have a large solubility in many RTILs, and this solubility can be tuned, for instance, by adjusting the chemical functionality of the anion or cation component, such as by using complexing or coordinating groups. The use of RTILs as solvent, solvent and co-reactant and/or promoter offers intriguing possibilities to achieve more selective and efficient deposition.

Other advantages of the methods described herein are that they avoid the use of high temperature and energy coating techniques, the use of corrosive gas such as H$_2$S, and long deposition times. For example, the methods described herein may be performed without the use of corrosive gases and at temperatures below 100° C. In certain embodiments, the method described herein may be performed at room temperature and atmospheric pressure. The techniques described herein also have the ability to control the stoichiometry of the metal precursor, chalcogenide precursor, and metal dopant composition. By changing the composition in the reaction medium, the property of the materials synthesized can be tuned.

In one embodiment, the present disclosure provides a method for fabricating a chalcogenide glass or film comprising: providing a solution comprising a room temperature ionic liquid; a metal precursor; and a chalcogenide precursor; providing a substrate; and applying the solution onto the substrate by a deposition process.

The room temperature ionic liquid may be any ionic compound which is a liquid at room temperature conditions (e.g. 25° C. and 1 atm). In certain embodiments, the room temperature ionic liquid may comprise a bulky and asymmetric organic cation and an anion. Suitable examples of cations may include 1-alkyl-3-methylimidazolium, 1-alkylpyridinium, N-methyl-N-alkylpyrrolidinium, and ammonium ions. Suitable examples of anions may include halides, inorganic anions such as tetrafluoroborate, hexafluorophosphate, large organic anions such as bistriflimide, triflate, or tosylate, and non-halogenated organic anions such as formate, alkylsulfate, alkylphosphate, or glycolate. A specific example of a room temperature ionic liquids may include a room temperature ionic liquid (PP$_{13}$-TSFI) comprising an N-methyl-N-propylpiperidinium cation (PP$_{13}^+$) and a bis(trifluoromethanesulfonyl)imide anion (TFSI$^-$). Other examples of room temperature ionic liquids may include PP$_{13}$-PF$_6$ and PP$_{13}$-BF$_4$. In certain embodiments, the room temperature ionic liquid may be any room temperature ionic liquid that is capable of dissolving the precursors without reacting the deposited chalcogenide glass or film.

The metal precursor may be any metal precursor that comprises an inorganic metal complex or metal halide and is capable of forming a chalcogenide glass when reacted with a chalcogenide precursor. In certain embodiments, the metal precursor may be a transition metal precursor. Examples of suitable metal precursors may include germanium precursors for germanium chalcogenide synthesis, tungsten precursors for tungsten chalcogenide synthesis, niobium precursors for niobium chalcogenide synthesis, cadmium precursors for cadmium chalcogenide synthesis, and molybdenum precursors for molybdenum chalcogenide synthesis. Suitable examples of germanium precursors include germanium (IV) bromide, germanium (IV) chloride, germanium (IV) ethoxide, germanium (IV) fluoride, germanium (IV) iodide, germanium (IV) isopropoxide, germanium (IV) methoxide, tetramethylgermanium, tributylgermanium hydride, germanium n-butoxide, di-n-butylgermanium dichloride, diethylgermanium dichloride, dimethylgermanium dichloride, germanium (II) bromide, germanium (II) chloride dioxane complex, and germanium (II) iodide. Suitable examples of telluride precursors include tellurium (IV) tetraiodide, tellurium (IV) tetrachloride, tellurium (IV) tetrabromide, and tellurium (IV) isopropoxide. Suitable examples of molybdenum precursors include molybdenum glycolate.

In certain embodiments, the metal precursor may be soluble in the room temperature ionic liquid. The metal precursor may be present in the solution in an amount in the range of 0.01M to 1M. In certain embodiments, the metal precursors may be present in the solution in the amount in the range of 0.05M to 0.25M. In certain embodiments, the metal precursor may be present in an equimolar concentration of the chalcogenide precursor.

The chalcogenide precursor may be any chalcogenide precursor that comprises a chalcogenide and is capable of forming a chalcogenide glass when reacted with a metal precursor. Examples of chalcogenide precursors may include sulfur compounds such as benzene-1,2-dithiol, benzene-1,3-dithiol, biphenyl-4,4'-dithiol, p-terphenyl-4,4"-dithiol, toluene-3,4-dithiol, 1,3-butanedithiol, 1,4-butanedithiol, 2,3-butanedithiol, 1,4-butanedithiol diacetate, 1,16-hexadecanedithiol, 1,4-benzenedimethanethiol, 1,2-ethanedithiol, 1,3-propanedithiol, 1,5-pentanedithiol, 1,6-hexandithiol, 1,8-octanedithiol, 1,8-octanedithiol diacetate, and 1,9-nonanedithiol. Examples of selenium compounds include selenium halides (SeX$_n$ where X=F, Cl, Br and n=1, 2, 3, 4), diselenium dihalides (Se$_2$X$_2$ where X=F, Cl, Br), diselenols (RSeH), phenylselenols, selenourea, and diselenides (R—Se—Se—R) such as dimethyl diselenide and diphenyl diselenide. In certain embodiments, the chalcogenide precursor may be soluble in the room temperature ionic liquid. The chalcogenide precursor may be present in the solution in an amount in the range of 0.01M to 1M. In certain embodiments, the chalcogenide precursor may be present in the solution in the amount in the range of 0.05M to 1M. In certain embodiments, the chalcogenide precursor may be present in an equimolar concentration of the metal precursor.

In certain embodiments, the substrate may comprise any substrate with a surface on which a chalcogenide glass or film may be deposited. In certain embodiments, the substrate may comprise a working electrode (or a component of a working electrode) found in a three electrode cell assembly. Examples of suitable substrates may include silicon nitride, molybdenum, or tungsten. In other embodiments, the substrate may be graphite, graphene, glassy carbon, pyrolized photoresist carbon films (PPF), indium doped tin oxide (ITO) glass sheets, stainless steel sheets, or silicon wafers coated with one side coated with a metal such as gold for connectivity.

In certain embodiments, the solution may be applied to the substrate using a deposition process. In certain embodiments, a three electrode cell assembly may be used during the deposition process. The three electrode cell may comprise a working electrode, a counter electrode, and a quasi-reference electrode (QRE). Suitable examples of working electrodes includes glassy carbon, indium coated tin oxide glass sheets, stainless steel sheets, or silicon wafers coated with one side coated with a metal such as gold for connectivity. Suitable examples of counter electrodes include Pt or graphite. Suitable examples of quasi-reference electrodes include Ag or Pt wire.

In certain embodiments, the substrate may be submerged into a three electrode cell assembly containing the solution. Direct current may then be applied to the electrodes in a range of from 0 to −3 volts, resulting in the deposition of the chalcogenide glass on the substrate. To vary the thickness of the film deposition time at constant potential may be varied from seconds to hours and/or the concentrations of metal precursor (0.01M to 1M) and chalcogenide precursor (0.01M to 1M) present in the ionic liquid may be varied. The temperature can also effect the film growth which can be varied from 20° C. to 150° C. The synthesized chalcogenide glass may then be washed with organic solvents such as acetone and stored in a dessicator.

In certain embodiments, the chalcogenide glass or film may be doped with a metal and/or metal ions such as Ag$^+$, Cu$^+$, Cu$^{+2}$, Zn$^{+2}$, or Li$^+$. In certain embodiments, a chalcogenide glass or film may be placed in a three electrode cell described above containing a solution comprising a room temperature ionic liquid and the metal ion. The metal ion may be present in the solution in an amount in the range of from 0.01M to 1M. Direct voltage may then be applied to the electrodes in a range from 1 to −1.5 volts, resulting in the doping of the chalcogenide glass with the metal ion.

In an alternative embodiment, a doped chalcogenide glass or film may be synthesized by adding a metal ion to the solution comprising the room temperature ionic liquid, the metal precursor, and the chalcogenide precursor and placing the solution in a three electrode cell. A doped chalcogenide glass or film may then become deposited on the substrate when current is applied to the electrodes.

In certain embodiments, the deposition may need to be performed by using a dry box, as certain germanium precursors may require a moisture free environment. However, once the germanium precursors are dissolved in the ionic liquid, the resulting mixture is stable enough to perform the deposition under standard laboratory conditions.

To facilitate a better understanding of the present disclosure, the following examples of certain aspects of some embodiments are given. In no way should the following examples be read to limit, or define, the entire scope of the disclosure.

EXAMPLES

Example 1

Synthesis of Germanium Chalcogenides

Preparation of Room Temperature Ionic Liquid (RTIL)

A RTIL was synthesized by the reaction of an equimolar mixture of N-methyl-N-propylpiperidinium (PP13) cation and bis(trifluoromethanesulfonyl)imide (TFSI) anion. The PP13 bromide was prepared by first mixing propylbromide with N-methylpiperidine in a 1:1 molar ratio in acetonitrile and stirred at 70° C. for 24 hours. White precipitate crystallized out in the solvent. The precipitate was washed in acetonitrile to remove unreacted reagents and dried under vacuum. The RTIL was prepared by the reaction of PP13-Br and LiTFSI in a 1:1 molar ratio in aqueous solution stirred at room temperature for 12 hours. An organic phase separates out of the uniform aqueous reaction mixture. The organic phase was extracted with CH$_2$Cl$_2$. The extract was washed thrice with DI water (18 MΩ cm) and the final organic extract was dried in a vacuum at 10° C. for 24 hours. The vacuum dried, thick, viscous, and colorless liquid was stored in a glove box for further electrochemical reactions.

Synthesis of GeS$_x$ Films

GeS$_x$ films were deposited from a 0.3M GeCl$_4$ and 0.3M 1,4-butanedithiol mixture in RTIL using a three electrode cell assembly. Glassy carbon (GC) or indium coated tin oxide (ITO) glass sheets were used as working electrodes, Pt or graphite as counter electrodes, and Ag wire as a quasi-reference electrode (QRE). The films were deposited potentiodynamically between 0 to −3 V. To vary the thickness of the film chronopotentiometry was utilized at −2.7V vs. Ag wire QRE at different time intervals. The synthesized GeS$_x$ films were washed with acetone and stored in a desiccator.

Ag Doping of GeS$_x$ Films:

Ag doping of the synthesized GeS$_x$ films was performed using an aqueous electrolyte solution containing 1 mM AgNO$_3$ in 0.2M H$_2$SO$_4$ in a three electrode cell. The potentiodynamic experiments were performed between 0.6 to −1.2V versus a Pt wire QRE, a platinum counter electrode and the GeS$_x$ film on either ITO or glassy carbon as the working electrode. To study different levels of Ag doping, a constant potential deposition was performed at −0.4V versus a Pt wire QRE.

Materials Characterization

Synthesized GeS$_x$ and Ag doped GeS$_x$ were characterized by different analytical techniques.

Raman spectroscopy was used to determine the stretching vibrational modes of GeS$_x$ and Ag doped GeS$_x$. Raman analyses were performed with a Renishaw In Via microscope system utilizing 514.5 nm incident radiation. A 50× aperture was used, resulting in an approximately 2 μm diameter sampling cross section.

X-ray photoelectron spectroscopy (XPS) was used to analyze the chemical environment of elements present in $GeS_x$ and Ag doped $GeS_x$. XPS was carried out with a Kratos AXIS Ultra DLD system calibrated using the signals for Au $4f_{7/2}$ at 83.98 eV.

X-ray diffraction was used to find the crystallinity and composition of the films. A Rigaku R-Axis Spider X-ray diffractometer was used with a Cu-Kα (λ=1.542 Å) source. The measurements were carried out under 40 kV and 40 mA by loading the sample in a 0.5 mm Nylon loop. The samples were scanned for 30 minutes with a rotation of 2° per minute. The data obtained were processed with 2DP software in the 2θ range of 10-90°.

Time resolved UV-Vis was carried out to study Ag doping in the $GeS_x$ films. An Agilent 8453 UV-visible spectrophotometer (Agilent Technologies) was used for absorption measurements during Ag doping of the $GeS_x$ films. All electrochemical studies were conducted at room temperature (23 (±2° C.) and were performed with a CH Instruments 700A potentiostat interfaced to a PC.

Scanning electron microscopy (SEM) was performed on the synthesized films with a Hitachi S-5500 high-resolution scanning tunneling microscope (STEM) operating at 30.00 kV. A Small portion of the film was removed from the substrate and dispersed in ethanol. This suspension was dropped in to the Cu TEM grid covered with a thin amorphous carbon film (Ted Pella) for the SEM analysis.

Figure 1:
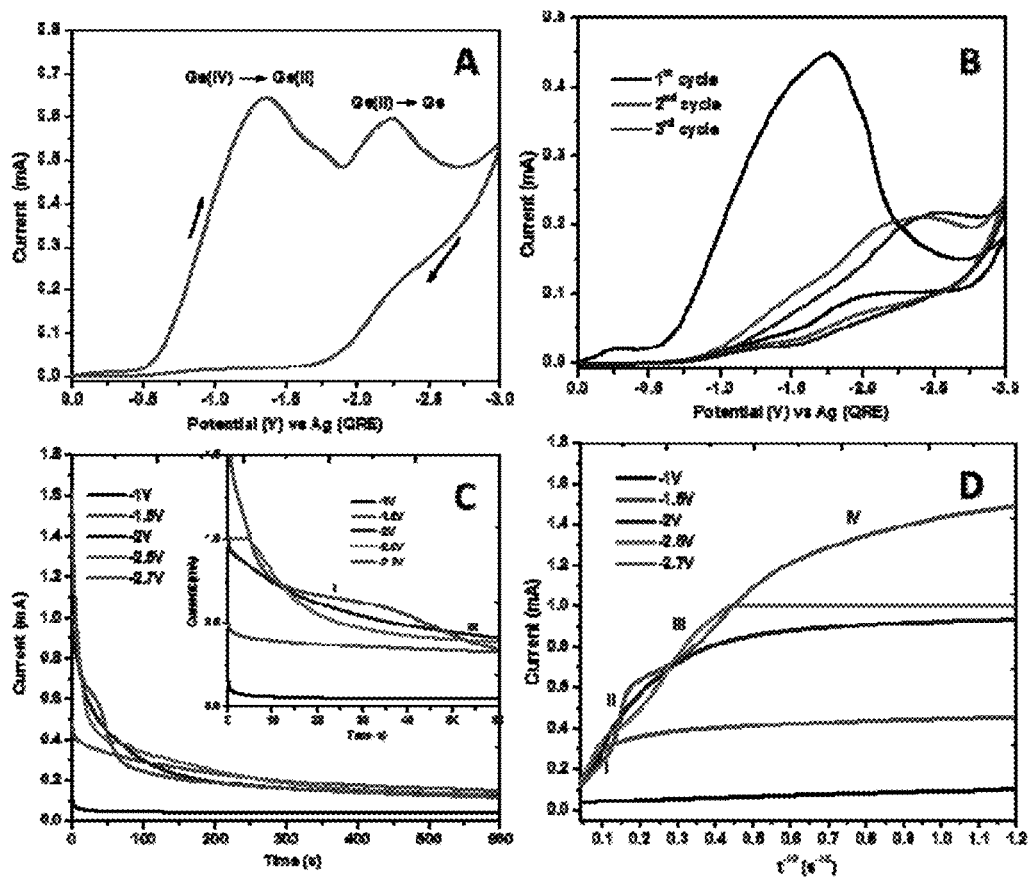
FIGS. 1A-1C are charts depicting the deposition of Ge film over GC working electrode.
FIG. 1D is a chart depicting a Cottrell plot.
Figure 2:
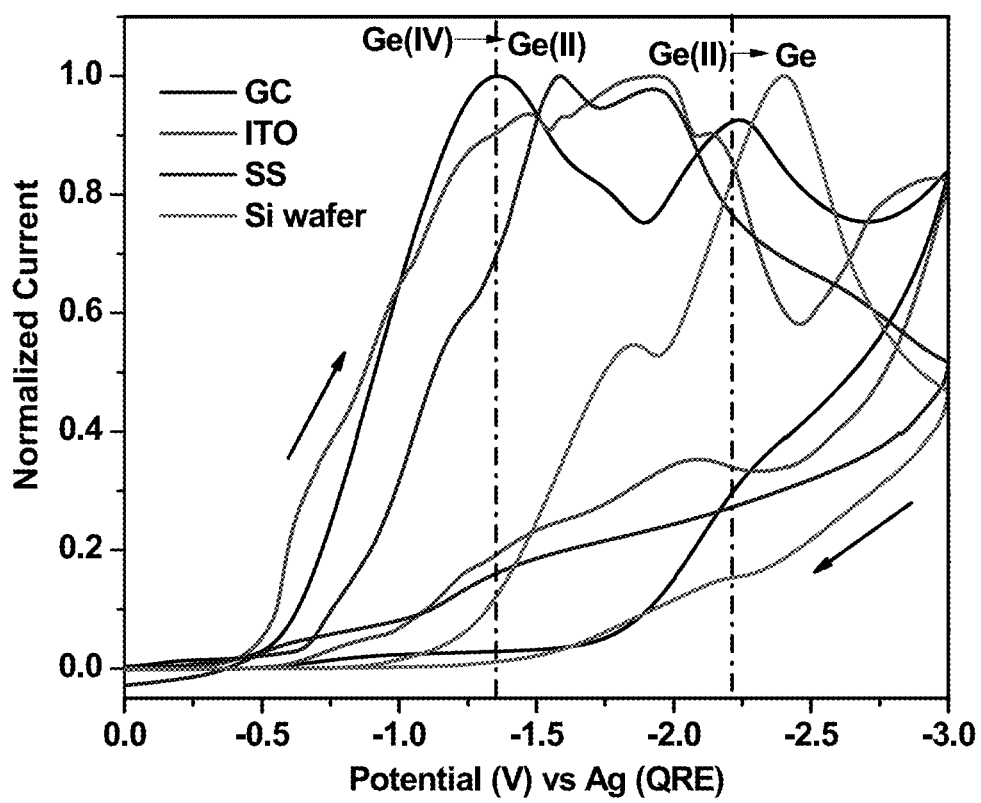
FIG. 2 is a chart depicting the electrochemical deposition of Ge on different working electrodes.

FIG. 1A shows the potentiodynamic deposition of Ge films over glassy carbon (GC) electrode. $GeS_x$ deposition was carried out using a potentiodynamic deposition method with a potential window of 0 to −3V vs. Ag (QRE). From the cyclic voltammogram, two anodic peaks are seen at −1.3V and −2.25V vs. Ag QRE. The peaks corresponded to the reduction of Ge(VI) to Ge(II) and reduction of Ge(II) to Ge(0), respectively. Ge films can be deposited in different conducting substrates such as glassy carbon, stainless steel, indium tin oxide (ITO) and Cu backed Si wafer by using RTIL containing 0.3M $GeCl_4$. However, the reduction potential of Ge may vary with substrate used. See FIG. 2. Deposition of $GeS_x$ over different electrode substrates resulted in appreciable difference in quality of the films. The overall qualities of the films are better in glassy carbon compared to stainless steel and Si.

FIG. 1B shows the potentiodynamic deposition of $GeS_x$ onto GC. During the deposition an anodic peak was observed at approximately −1.8V versus an Ag QRE on a GC substrate. The peak may be attributed to the complexation of sulfur and germanium sources with ionic liquid. Once it formed the complex with the reactants, it proceeded through an induced co-deposition process. It was also noticed that in preparing the $GeS_x$ films, a solid white precipitate formed in the electrolyte solution.

In order to understand the mechanism of $GeS_x$ formation, chronopotentiometric experiments were performed at different potentials, see FIG. 1C, for 600 seconds. This experiment demonstrated that the depositions may be stable after 100 seconds at all the potentials. However, at the potential −2.7 V vs Ag (QRE), a different behavior with step formations was observed. Three step formations at −2.7V were observed, which was further confirmed by the Cottrell plot, see FIG. 1D. This may be the initial step of complexation of Ge and sulfur precursors with ionic liquid. The deposition rate of thin film of 2D character may increase in time once the 2D layer is finished. Crystal growth followed on the top of pre deposited surface by the Stranski-Krastanov nucleation and growth mechanism.

Figure 3:
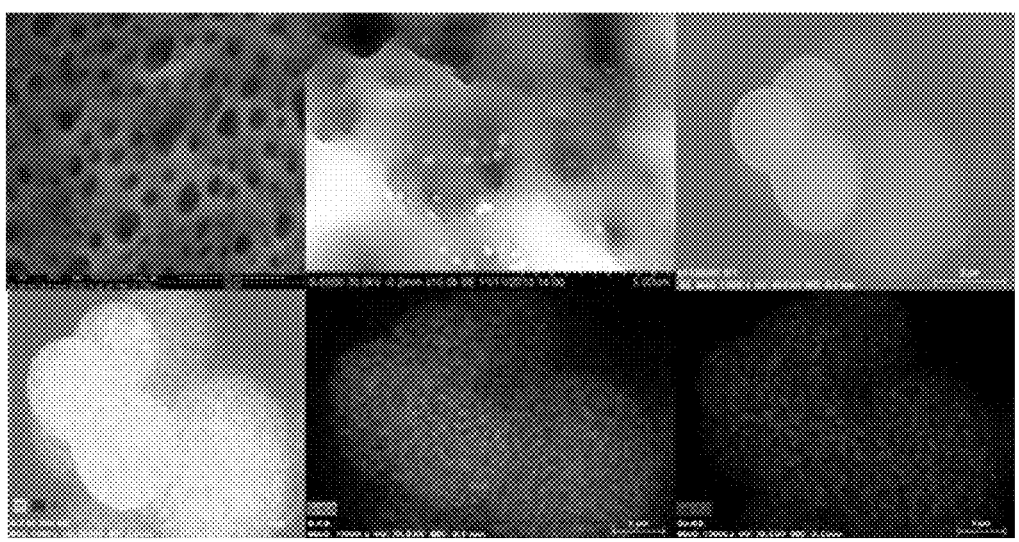
FIG. 3 is an SEM-EDS analysis of $GeS_x$ film deposited on GC.

Analysis of the films by SEM-EDS showed a porous character with particles on top of the film, see FIG. 3. FIG. 3A shows the large area coverage with smooth and porous structure. The smooth surface contains small particles, as shown in FIG. 3B. These particles were confirmed to be $GeS_x$ by EDS elemental mapping analysis, as shown in FIGS. 3C and 3D. The presence of small spherical particles over the surface further supported that the Stranski-Krastanov Mechanism of electrodeposition took place. Silver doping of $GeS_x$ films was performed by an Ag stripping experiment in aqueous 1 mM $AgNO_3$ in 0.2M $H_2SO_4$. To find the viability of this method, spectroelectrochemical experiments were performed with ITO and $GeS_x$/ITO as the working electrode. From the experiment it was determined that Ag deposited at −0.4V versus Pt QRE. Thereby, a constant potential deposition of Ag was carried out on the $GeS_x$ films at −0.4V vs. Pt QRE for 600 seconds.

Figure 4:
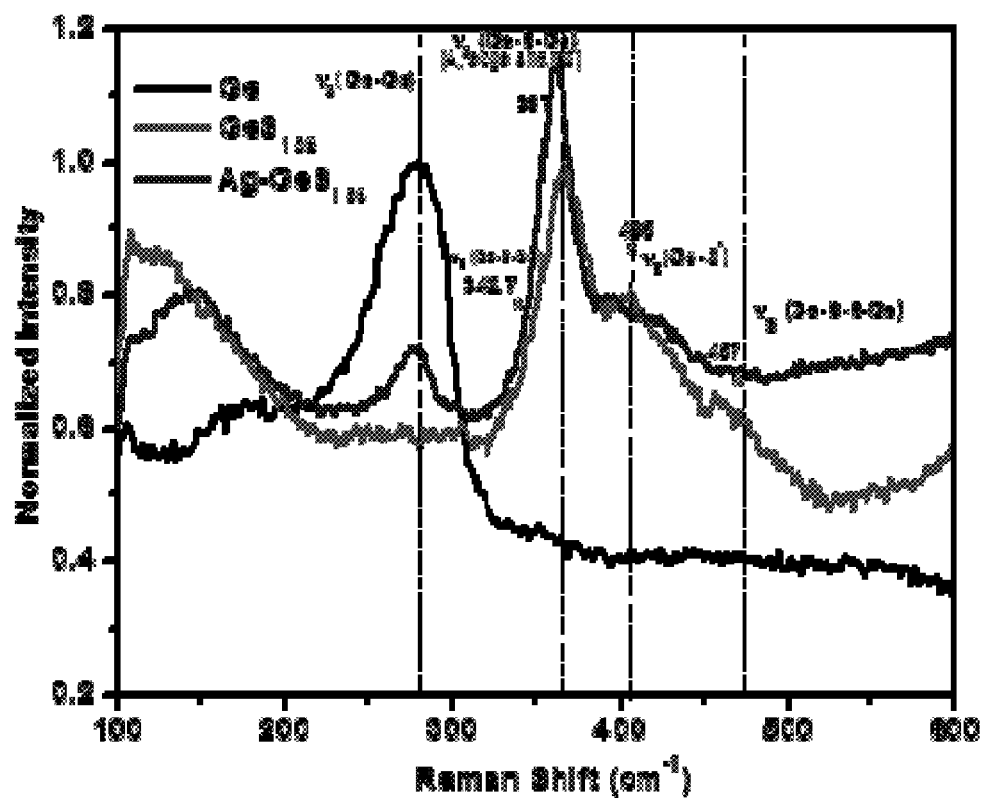
FIG. 4 is a chart depicting a Raman characterization of electrodeposited amorphous Ge, $GeS_x$ and Ag doped $GeS_x$ films.
Figure 5:
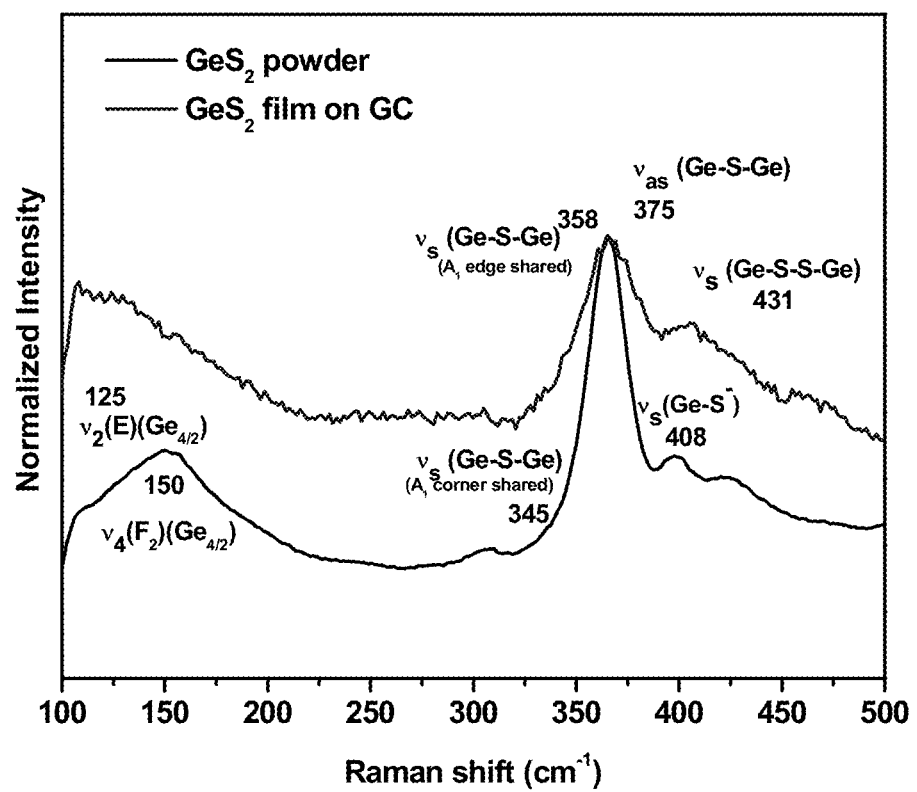
FIG. 5 is a chart depicting a Raman spectrum of white powder obtained during the electrodeposition of $GeS_x$ in the ionic liquid.
Figure 6:
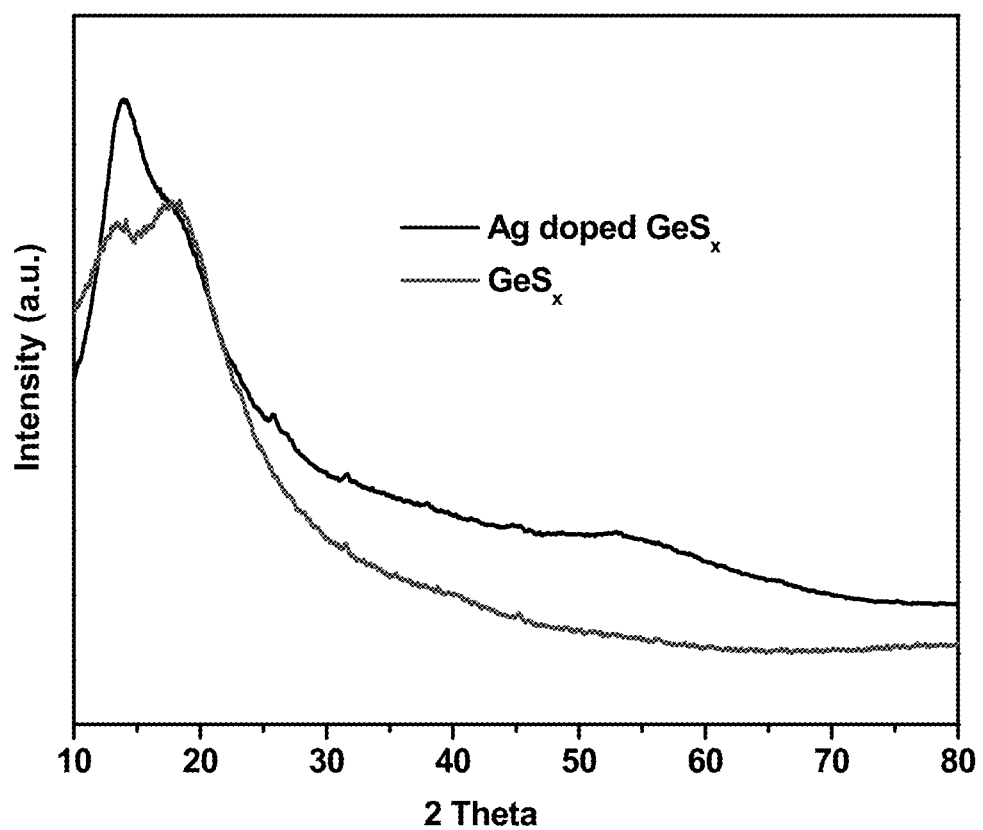
FIG. 6 is a chart depicting XRD analyses.

Ge and $GeS_x$ showed very strong Raman cross sectional area at 300 $cm^{-1}$ and 347 $cm^{-1}$ respectively. FIG. 4 shows the Raman spectrum of electrodeposited Ge and $GeS_x$ films on GC. Electrodeposited Ge films showed a large peak at 280 $cm^{-1}$, which was attributed to the amorphous nature which is consistent with prior data. This peak was absent in the $GeS_x$ films and prominent peaks present at, 342.7, 367, 405, 437, and 457 $cm^{-1}$. The peak at 347.2 $cm^{-1}$ may likely stretching from $GeS_4$ tetrahedra and the peak at 367 $cm^{-1}$ may likely be related to $GeS_4$ tetrahedra; 375 and 374 $cm^{-1}$ respectively for $GeS_4$ tetrahedra. The 405, 437 and 457 $cm^{-1}$ peaks were likely due to various S—S stretching. Comparison of Ag doped versus undoped films showed a large peak around 278 $cm^{-1}$ present in the spectrum for Ag doped films that is not present in undoped. This is possibly caused by ethane like $GeS_x$ structures. This change was not present in the undoped films giving strong evidence that Ag was successfully doped into the films. Examination of the white precipitate that formed in the $GeCl_4$/1,4-butanedithiol solution by Raman showed that it was $GeS_x$, as shown in FIG. 5. XRD analysis of the Ag doped and undoped $GeS_x$ films showed amorphous character, as shown in FIG. 6.

Figure 7:
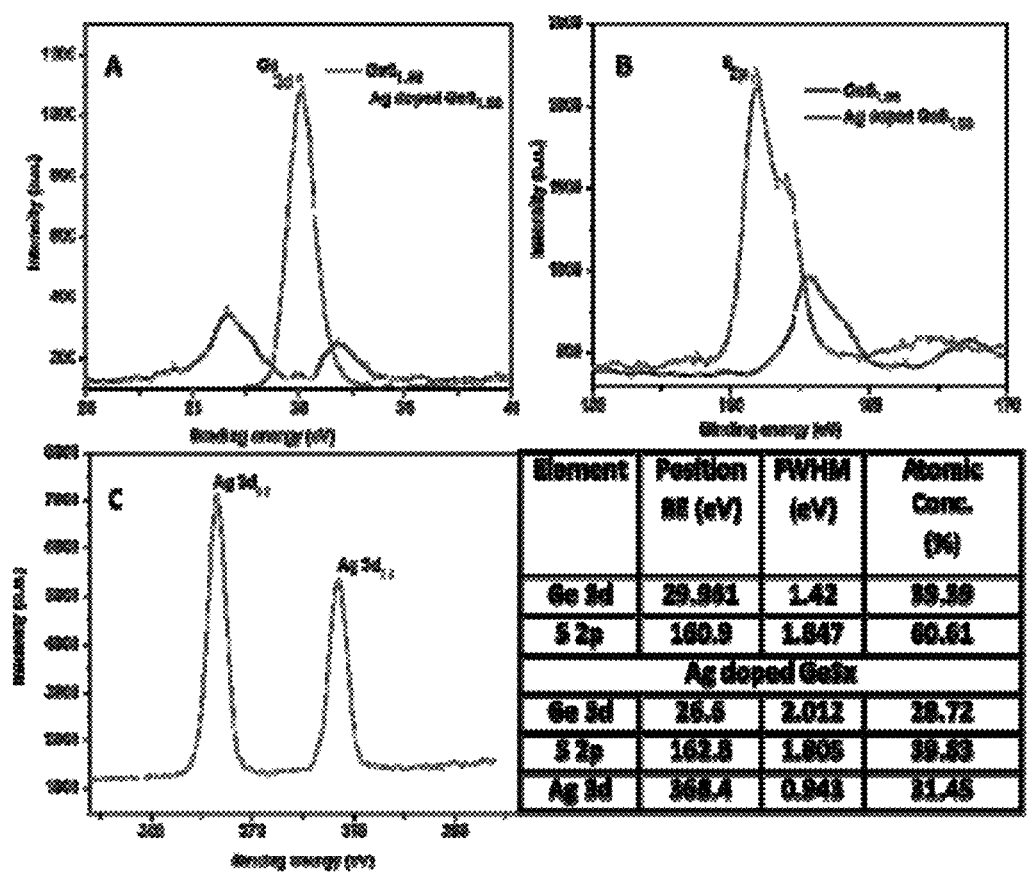
FIG. 7 is a chart depicting XPS analyses.

XPS analysis provided further evidence for the synthesis of $GeS_x$ and Ag doping the films. XPS analysis of Ge, as shown in FIG. 7A, in the undoped films shows correlation to $GeS_x$ species at approximately 30 eV. After doping with Ag, the Ge peak split and reduced in intensity with two peaks at about 26.7 eV and 31.7 eV. Prior work has shown that after Ag doping the peak splits. Examination of the sulfur in the undoped films gave a spectra consistent with sulfur in $GeS_x$ species as well, with a peak at around 161 eV, as shown in FIG. 7B. This peak reduced in intensity and shifted to greater binding energy after doping with Ag to about 162.8 eV. The observation of such sifts in the $GeS_x$ and Ag doped $GeS_x$ films gave strong support to the notion that Ag was successfully doped into the films. The XPS results for the Ag in the doped films gave excellent correspondence to values with peaks at about 368 and 374 eV corresponds to $3d_{5/2}$ and $3d_{3/2}$ orbital splitting respectively, as shown in FIG. 7C. Examination through peak integration showed an atomic concentration of 39.39% Ge and 60.61% S for an undoped film revels that the composition of $GeS_x$ film is $GeS_{1.54}$. For the Ag doped films show atomic concentration of 28.77% Ge, 39.83% S, and 31.45% confirms that Ag is possible by this method, as shown in FIG. 7D. The maximum amount of Ag that can be doped on $GeS_2$ using other methods may only be about 35%.

Figure 8A:
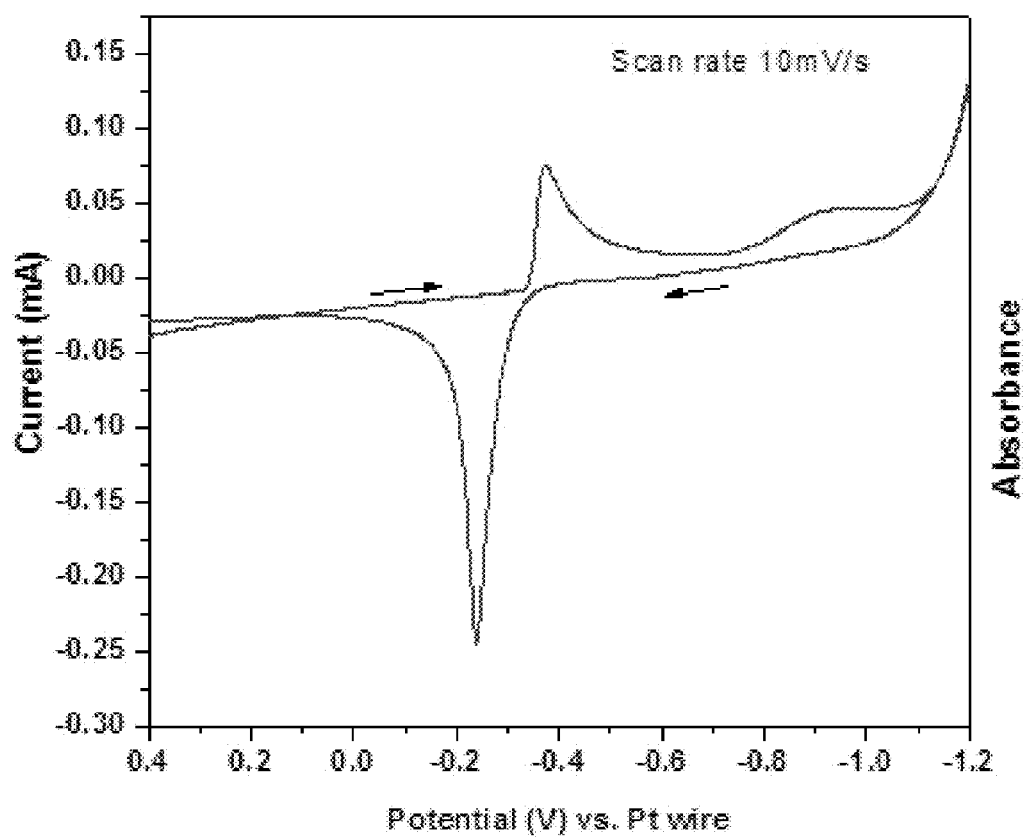
FIG. 8A is a chart depicting a cyclic voltammogram.
Figure 8B:
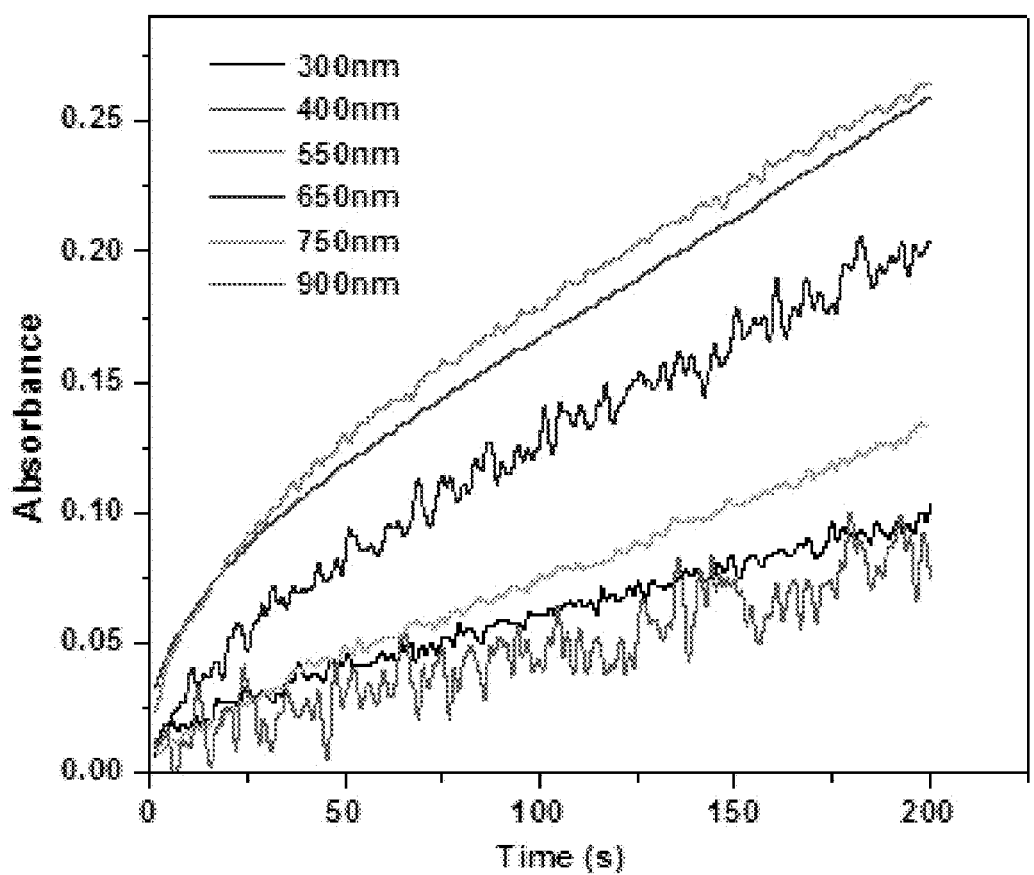
FIG. 8B is a chart depicting the absorbance of ITO.
Figure 8C:
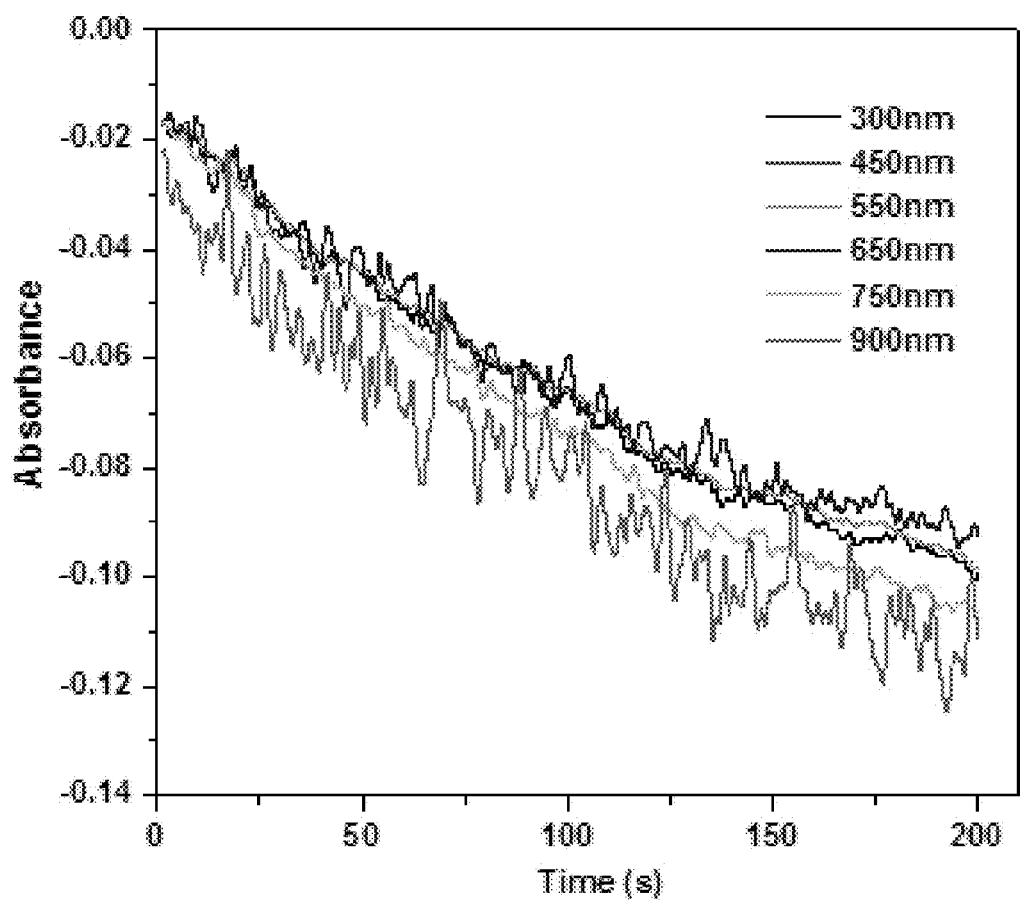
FIG. 8C is a chart depicting the absorbance of $GeS_x$.

Initial cyclic voltammetry experiments were carried out in an aqueous solution of 1 mM AgNO$_3$ in 0.2M H$_2$SO$_4$ between 0.6 to −1.2V versus Pt QRE and a Pt counter electrode and ITO as the working electrode, as shown in FIG. 8A. Absorbance as a function of time as the deposition took place was taken for several wavelengths. From this data it was determined that Ag deposited at −0.4V versus Pt QRE. A constant potential deposition of Ag was carried out on the GeS$_x$ films on ITO or plain ITO at −0.4V vs. Pt QRE for various periods of time, as shown in FIGS. 8B and 8C. The absorbance of the bare ITO increased across all frequencies as the deposition proceeded, indicating that an opaque film was being produced; examination of the slide after the experiment confirmed this. The absorbance of the GeS$_x$ films decreased as the time of deposition went on. This indicates that an Ag film was not produced but that silver clusters are being doped into the structure of the GeS$_x$ films.

Example 2

Synthesis of Molybdenum Chalcogenides

Preparation of Molybdenum Precursor

Molybdenum glycolate was prepared by reacting 1.5 g MoO$_3$ with 250 mL ethylene glycol at 194° C. for 1 hr under a nitrogen atmosphere. Brown color viscous final product was extracted after the reaction.

Synthesis of MoS$_x$ Films

MoS$_x$ films were deposited from a 1004 C$_2$H$_3$MoO$_3$ and 100 μL (0.85 mmol) 1,4-butanedithiol mixture in RTIL using a three electrode cell assembly. Glassy carbon (GC) or indium coated tin oxide (ITO) glass sheets were used as working electrodes, Pt or graphite as counter electrodes, and Pt wire as a quasi-reference electrode (QRE). The films were deposited potentio-dynamically between 0 to −2.7 V. To vary the thickness of the film the numbers of cycles have been varied and chronopotentiometry was utilized at −2.7V vs. Pt wire QRE at different time intervals. The synthesized MoS$_x$ films were washed with acetone and stored in a desiccator.

Materials Characterization

Synthesized MoS$_x$ was characterized by different analytical techniques. Raman spectroscopy was used to determine the stretching vibrational modes of MoS$_x$.

Raman analyses were performed with a Renishaw In Via microscope system utilizing 514.5 nm incident radiation. A 50× aperture was used, resulting in an approximately 2 μm diameter sampling cross section. The spectral samples were collected over 20 second exposure time.

X-ray photoelectron spectroscopy (XPS) was used to analyze the chemical environment of elements present in MoS$_x$. XPS was carried out with a Kratos AXIS Ultra DLD system calibrated using the signals for Au 4f$_{7/2}$ at 83.98 eV.

Scanning electron microscopy (SEM) was performed with a Quanta 650 operated at 30.00 kV. Electrodeposited MoSx films over GC (1 cm×1 cm) were mounted on the Al stub with double sided carbon tape (Ted Pella) for the SEM analysis.

Figure 9:
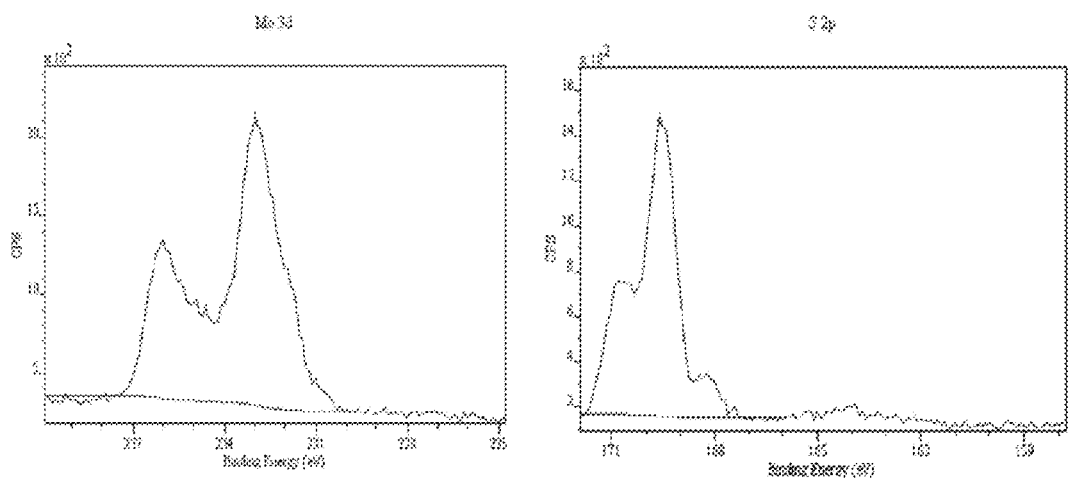
FIG. 9 is a chart depicting an XPS analyses.

XPS analysis provided further evidence for the synthesis of MoS$_x$. XPS analysis of Mo, as shown in FIG. 9A shows correlation to the Mo 3d$_{512}$ peak at 228.5 ev on the deposited thin film using a 1:1 Mo:S precursor ratio. The 228.5 eV value corresponds to Mo in the fourth oxidation state. Examination of the sulfur gave spectra consistent with sulfur in MoS$_x$ species as well, with a peak at around 162.5 eV corresponds to 2p$_{1/2}$ as shown in FIG. 9B. Examination through peak integration showed an atomic concentration of 33.49% Mo and 66.51% S reveals that the composition of MoS$_x$ film is MoS$_2$.

Figure 10:
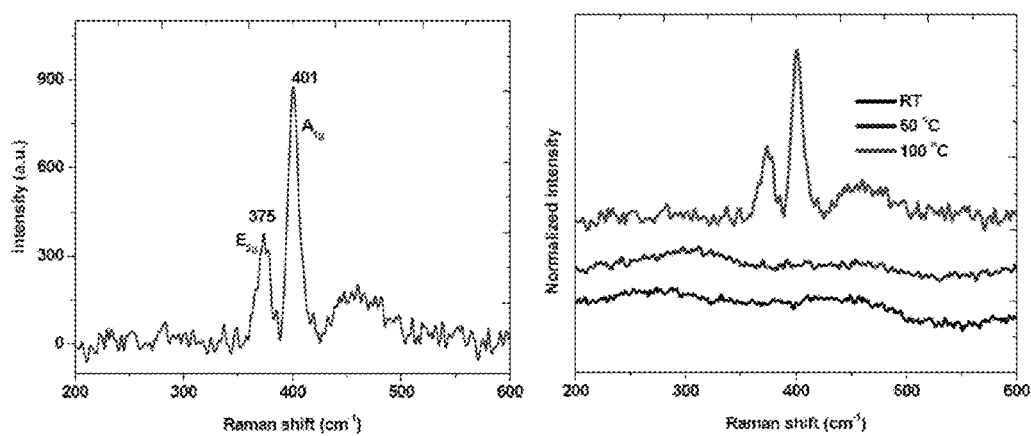
FIG. 10 is a chart depicting a Raman characterization of electrodeposited $MoS_x$ films.

FIG. 10 shows the Raman spectrum of electrodeposited MoS$_x$ films on GC. Electrodeposited Mo films showed two sharp Raman modes, E$_{2g}^1$ (375 cm$^{-1}$) and A$_{1g}$ (401 cm$^{-1}$). Weak second-order scattering process 2−LA(M) mode was seen near 452 cm$^{-1}$. These results suggest formation of a few layers of MoS$_2$.

FIG. 11 shows the potentiodynamic deposition of MoS$_2$ films over glassy carbon (GC) electrode. Analysis of the films by SEM-EDS showed a porous character with particles on top of the film, see FIG. 11C. These particles were confirmed to be MoS$_x$ by EDS elemental mapping analysis, as shown in FIG. 12. The presence of small spherical particles over the surface further supported that the Stranski-Krastanov Mechanism of electrodeposition took place.

FIG. 13 shows the hydrogen evolution reaction (HER) activity of MoS$_2$ films. A high HER activity with Tafel slope of 151.1 mV/decade was observed with layer dependent activity of MoS$_2$ films.

Therefore, the present invention is well adapted to attain the ends and advantages mentioned as well as those that are inherent therein. While numerous changes may be made by those skilled in the art, such changes are encompassed within the spirit of this invention as illustrated, in part, by the appended claims.

What is claimed is:

1. A method for fabricating a germanium glass or film comprising:
    providing a solution comprising a room temperature ionic liquid, a germanium precursor, and a chalcogenide precursor, wherein the room temperature ionic liquid comprises PP$_{13}$-TFSI, the germanium precursor comprises GeCl$_4$, and the chalcogenide precursor comprises 1,4-butanedithiol;
    providing a substrate; and
    applying the solution onto the substrate by a deposition process.

2. The method of claim 1, wherein the deposition process is performed at a temperature in the range of from about 20° C. to 150° C.

* * * * *